United States Patent
Ookawa

(10) Patent No.: US 7,990,142 B2
(45) Date of Patent: Aug. 2, 2011

(54) MRI APPARATUS GENERATING DEFORMED BINOMIAL PULSE WAVEFORMS BASED ON FLIP ANGLE

(75) Inventor: Masashi Ookawa, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 172 days.

(21) Appl. No.: 12/261,543

(22) Filed: Oct. 30, 2008

(65) Prior Publication Data
US 2009/0118607 A1 May 7, 2009

(30) Foreign Application Priority Data
Nov. 2, 2007 (JP) ................................. 2007-285888

(51) Int. Cl.
*G01V 3/00* (2006.01)
(52) U.S. Cl. .................... 324/309; 324/307; 324/318
(58) Field of Classification Search .......... 324/300–322; 600/410, 411, 422, 423, 413, 425; 382/125, 382/128–131
See application file for complete search history.

(56) References Cited

U.S. PATENT DOCUMENTS

| 3,052,834 | A | * | 9/1962 | Schuster | 324/313 |
|---|---|---|---|---|---|
| 4,739,766 | A | * | 4/1988 | Riederer | 600/413 |
| 4,760,336 | A | * | 7/1988 | Conolly | 324/309 |
| 5,111,143 | A | * | 5/1992 | McKinnon et al. | 324/307 |
| 5,920,641 | A | * | 7/1999 | Ueberreiter et al. | 382/125 |
| 6,272,369 | B1 | * | 8/2001 | Tan | 600/410 |
| 6,801,037 | B1 | * | 10/2004 | Zhang | 324/309 |
| 7,042,214 | B2 | * | 5/2006 | Cunningham et al. | 324/307 |
| 7,081,750 | B1 | * | 7/2006 | Zhang | 324/309 |
| 7,372,270 | B2 | * | 5/2008 | Sung et al. | 324/314 |
| 7,479,783 | B2 | * | 1/2009 | Alsop | 324/307 |
| 7,482,805 | B2 | * | 1/2009 | Feiweier | 324/307 |
| 2005/0215882 | A1 | * | 9/2005 | Chenevert et al. | 600/410 |
| 2007/0057673 | A1 | * | 3/2007 | Nayak et al. | 324/307 |
| 2007/0085537 | A1 | * | 4/2007 | Feiweier | 324/307 |
| 2008/0111547 | A1 | * | 5/2008 | Alsop | 324/309 |
| 2008/0114235 | A1 | * | 5/2008 | Unal et al. | 600/411 |
| 2009/0118607 | A1 | * | 5/2009 | Ookawa | 600/410 |
| 2009/0121714 | A1 | * | 5/2009 | Feiweier | 324/309 |
| 2009/0257634 | A1 | * | 10/2009 | Moeller et al. | 382/131 |
| 2010/0171499 | A1 | * | 7/2010 | Sharp et al. | 324/318 |
| 2011/0044524 | A1 | * | 2/2011 | Wang et al. | 382/131 |

FOREIGN PATENT DOCUMENTS

JP    8-591    1/1996

* cited by examiner

*Primary Examiner* — Brij B. Shrivastav
*Assistant Examiner* — Tiffany A Fetzner
(74) *Attorney, Agent, or Firm* — Nixon & Vanderhye PC

(57) ABSTRACT

An MRI apparatus has a waveform setting unit, an applying control unit, a reconstructing unit, and a display control unit. The waveform setting unit sets an asymmetric RF pulse Waveform. The applying control unit controls an application of a pulse in accordance with the RF pulse waveform. The reconstructing unit reconstructs an image based on a signal received by the application. The display control unit controls a display of the image.

13 Claims, 9 Drawing Sheets

| FLIP ANGLE RATIO OF BINOMIAL PULSE | FLIP ANGLE RATIO OF DEFORMED BINOMIAL PULSE | |
|---|---|---|
| | UNIFORMLY ADDING | PROPORTIONALLY ADDING |
| 1–1 SERIES | — | — |
| 1–2–1 SERIES | (3/2)–(5/2) SERIES | (4/3)–(8/3) SERIES |
| 1–3–3–1 SERIES | (4/3)–(10/3)–(10/3) SERIES | (8/7)–(24/7)–(24/7) SERIES |
| 1–4–6–4–1 SERIES | (8/3)–(17/3)–(23/3) SERIES<br>(5/4)–(17/4)–(25/4)–(17/4) SERIES | (16/11)–(64/11)–(96/11) SERIES<br>(16/15)–(64/15)–(96/15)–(64/15) SERIES |
| ⋮ | | |

FIG. 4

1-3-3-1 SERIES 1-1 SERIES (8/7)-(24/7)-(24/7) SERIES

MRI APPARATUS GENERATING DEFORMED BINOMIAL PULSE WAVEFORMS BASED ON FLIP ANGLE

BACKGROUND OF THE INVENTION

1. Field of the Invention

The present invention relates to an MRI apparatus for generating a MRI (magnetic resonance imaging) image using a binomial pulse for exciting a species of nuclear spin.

2. Description of the Related Art

An MRI apparatus is a unit with an imaging process for reconstructing the MRI image of a cross section in an object based on an MR signal generated by magnetically exciting a species of nuclear spins of the object in the static magnetic field with a high frequency signal at Larmor frequency.

When generating an MRI image based on MR signal received by water (free water) excitation with the MRI apparatus, a fat suppression technology (to reduce collection of MR signal from fat) is necessary to avoid chemical shift artifact caused by fat (bound water) in cross section. Meanwhile, when generating an MRI image based on MR signal received by fat excitation, water suppression technology (to reduce collection of MR signal from water) is necessary to avoid chemical shift artifact caused by water in the cross section. Generally, processes using various types of pulse sequences have been well known to perform the aforementioned fat suppression and water suppression. For example, signal from fat or water may be suppressed using a frequency selective excitation pulse. The process employs an RF wave envelope (binomial pulse) with a flip angle ratio of 1-2-1 series or 1-3-3-1 series of water or fat as the frequency selective excitation pulse.

However, in order to improve properties of water excitation and fat excitation with generally employed technology, both an echo time (TE) and a repetition time (TR) are prolonged, and accordingly, the entire imaging time becomes long, which may exert stress to the object.

In the generally employed art, the segregation property between water and fat sometimes cannot be further improved owing to weakened susceptibility because the longer the pulse length becomes, the lower the S/N ratio becomes.

SUMMARY

The present exemplary embodiment has taken into consideration the above-described problems, and it is a purpose of the present exemplary embodiment to provide a MRI apparatus of the which is capable of alleviating the stress to the object (patient) during the imaging operation.

Further, the present exemplary embodiment has taken into consideration the above-described problems, and it is a purpose of the present exemplary embodiment to provide a MRI apparatus of the which is capable of providing an MRI image optimum for image diagnosis.

To solve the above-described problems, the present exemplary embodiment provides MRI apparatus comprising: a waveform setting unit configured to set an asymmetric RF pulse waveform; an applying control unit configured to control an application of a pulse in accordance with the RF pulse waveform; a reconstructing unit configured to reconstruct an image based on a signal received by the application; and a display control unit configured to control a display of the image.

To solve the above-described problems, the present exemplary embodiment provides the MRI apparatus for generating an MRI image using a binomial pulse for a same nuclide excitation, comprising: a waveform setting unit configured to generate and set a deformed binomial pulse waveform by deleting a portion of the binomial pulse waveform and adding an flip angle calculated based on the deleted waveform to a rest of the waveform if a number of waves of the binomial pulse waveform is 3 or more; and an applying control unit configured to control application of a pulse in accordance with the deformed binomial pulse waveform set by the waveform setting unit.

To solve the above-described problems, the present exemplary embodiment provides the MRI apparatus for generating an MRI image using a binomial pulse for a same nuclide excitation, comprising: a waveform setting unit configured to generate and set a deformed binomial pulse waveform by admeasuring an intensity or a flip angle which should be used for one waveform included in the binomial pulse waveform to the other waveform; and an applying control unit configured to control application of a pulse in accordance with the deformed binomial pulse waveform set by the waveform setting unit.

BRIEF DESCRIPTION OF THE DRAWINGS

In the accompanying drawings:

FIG. 4 is an explanatory view showing an example where a deformed binomial pulse waveform as an asymmetric pulse waveform is generated;

DESCRIPTION OF THE PREFERRED EMBODIMENTS

Figure 1:
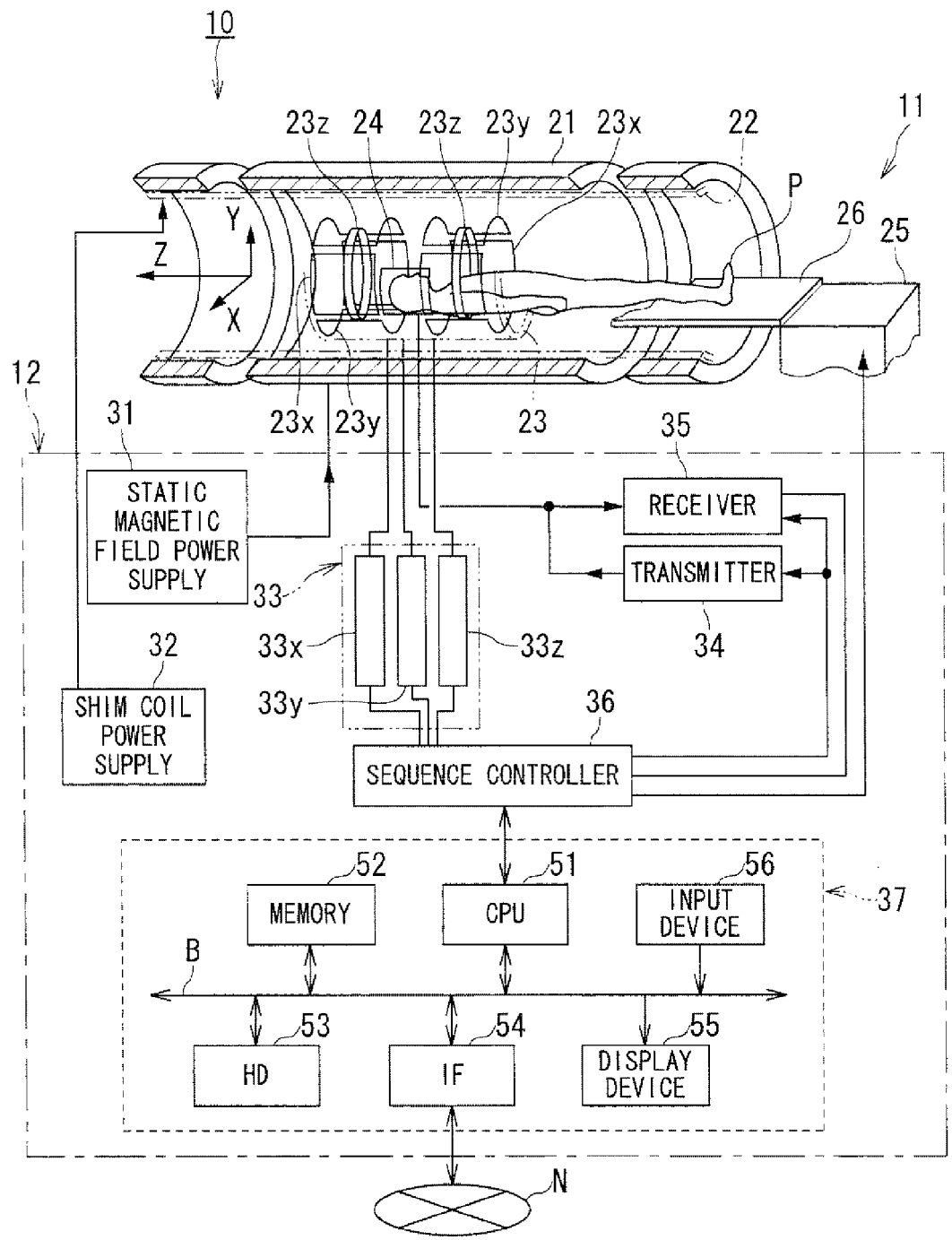
FIG. 1 is a view schematically showing a hardware structure of an MRI apparatus according to an embodiment of the present invention.

An embodiment of an MRI apparatus according to the present invention will be described referring to the drawings.

FIG. 1 is a view schematically showing a hardware structure of an MRI apparatus according to the embodiment of the present invention.

FIG. 1 shows the MRI apparatus 10 according to the embodiment for generating an MRI image using a binomial pulse for exciting the same nuclide. The MRI apparatus 10 is mainly formed of an imaging system 11 and a control system 12.

The imaging system 11 of the MRI apparatus 10 includes a gantry (not shown) which stores a static field magnet 21, a cylindrical shim coil 22 provided inside the static field magnet 21 coaxially therewith, and a cylindrical gradient coil unit 23 formed inside the static field magnet 21. The imaging system 11 includes an RF coil 24 and a bed mechanism 25 which retractably moves a patient P with respect to the gantry.

The control system 12 of the MRI apparatus 10 includes a static magnetic field power supply 31, a gradient magnetic field power supply 33, a shim coil power supply 32, a transmitter 34, a receiver 35, a sequence controller (sequencer) 36, and a computer 37.

The static field magnet 21 is connected to the static magnetic field power supply 31 for supplying electric current to generate the static magnetic field at an imaging region (FOV: Field of view).

The shim coil 22 is connected to the shim coil power supply 32 for supplying electric current to the shim coil 22 to uniformize the static magnetic field.

The gradient coil unit 23 is formed of an X-axis gradient coil 23$x$, a Y-axis gradient coil 23$y$, and a Z-axis gradient coil 23$z$. A tabletop (bed) 26 on the bed mechanism 25 is formed inside the gradient coil unit 23 to accommodate the patient P to lie down and moved by the bed mechanism 25.

The gradient coil unit 23 is connected to the gradient magnetic field power supply 33. The X-axis gradient coil 23$x$, the Y-axis gradient coil 23$y$, and the Z-axis gradient coil 23$z$ of the gradient coil unit 23 are connected to the X-axis gradient magnetic field power supply 33$x$, the Y-axis gradient magnetic field power supply 33$y$, and the Z-axis gradient magnetic field power supply 33$z$ of the gradient magnetic field power supply 33, respectively.

Further, electric current supplied to the K-axis gradient coil 23$x$ from the X-axis gradient magnetic field power supply 33$x$, the Y-axis gradient coil 23$y$ from the Y-axis gradient magnetic field power supply 33$y$, and the Z-axis gradient coil 23$z$ from the Z-axis gradient magnetic field power supply 33$z$ generates a gradient magnetic field Gx in the X-axis direction, a gradient magnetic field Gy in the Y-axis direction and a gradient magnetic field Gz in the Z-axis direction in the imaging region.

The RF coil 24 is formed of a multi coil, and connected to the transmitter 34 and the receiver 35. The RF coil 24 functions in sending a high frequency signal (RF: radio frequency) at Larmor frequency to an imaging site of the patient (object) P upon reception of the high frequency signal from the transmitter 34, and functions in receiving a nuclear magnetic resonance (NMR) signal generated by excitation with the high frequency signal of the nucleus spin inside the imaging site, and sending the signal to the receiver 35. Note that, the signal may be sent to/received from the RF coil 24 with a single coil serving as the transmission coil and the reception coil, or with the transmission coil and the reception coil separately. The MRI apparatus 10 in FIG. 1 shows a coil for head which is a single coil serving as the transmission coil and the reception coil as an example of the RF coil 24.

Meanwhile, the sequence controller 36 of the control system 12 is connected to the bed mechanism 25, the gradient magnetic field power supply 33, the transmitter 34 and the receiver 35. The sequence controller 36 includes a not shown processor, for example, a CPU (central processing unit) and a memory structured to store control information required to drive the bed mechanism 25, the gradient magnetic field power supply 33, the transmitter 34 and the receiver 35, for example, intensity of the pulse current applied to the gradient magnetic field power supply 33, the time period for application of the pulse current, and sequence control which contains the operation control information such as the application timing.

The sequence controller 36 drives the bed mechanism 25 in accordance with the stored predetermined sequence to move the table-top 26 retractably in the Z-axis direction with respect to the gantry. Further, the sequence controller 36 drives the gradient magnetic field power supply 33, the transmitter 34, and the receiver 35 in accordance with the stored predetermined sequence to generate the X-axis gradient magnetic field Gx, the Y-axis gradient magnetic field Gy, the Z-axis gradient magnetic field Gz, and the RF signal in the gantry.

The transmitter 34 sends the RF signal to the IP coil 24 based on the control information from the sequence controller 36. Meanwhile, the receiver 35 subjects the NMR signal received from the RF coil 24 to a predetermined signal processing and an analog to digital (A/D) conversion to generate raw data as digitized NMR signal from the receiver 35. The generated raw data are transmitted to the sequence controller 36 so as to be sent to the computer 37.

The computer 37 has a basic hardware structure including a CPU 51 as a processor, a memory 52, a hard disk (HD) 53, an interface (IF) 54, a display device 55, and an input device 56. The CPU 51 is connected to the hardware components 52, 53, 54, 55 and 56 which constitute the computer 37 mutually via a bus B as a common signal transmission path. The computer 37 is connected to the network N such as a local area network (LAN) of the infrastructure built in a hospital so as to be mutually communicated via the IF 54 such that the past image (to be described later) is derived from a not shown image control device (server) on the network N.

Note that, the computer 37 may be provided with a drive for reading various application programs and data from the medium which stores the application programs and data.

The CPU 51 runs the program stored in the memory 52. Alternatively, the CPU 51 runs the program stored in the HD 53, and the program transferred from the network N, received by the IF 54, and installed in the HD 53, which are loaded into the memory 52.

The memory 52 is a storage device that has a read only memory (ROM) and a random access memory (RAM). The memory 52 stores a basic input/output system (BIOS), an initial program loading (IPL), and the image, and is used as a work memory of the CPU 51 and a temporarily storage of data.

The HD 53 is a storage device formed by a metal disk to which the magnetic material is applied or deposited, and built in a data reader (not shown) so as not to be detached. The HD 53 is a data storage unit for storing the program installed in the computer 37 (including an operation system (OS) in addition to the application program) and image data such as MRI image. The OS may be provided with a graphical user interface (GUI) through which the basic operation is performed by the graphics laden input device 56 for displaying the information for the user.

The IF 54 is a communication control unit for executing the communication control in accordance with the respective standards, and allows the computer 37 to be connected to the network N.

The display device 55 includes a digital to analog (D/A) conversion circuit and a monitor for displaying the MRI image.

A keyboard and a mouse operated by an operator as an engineer may be employed as the input device 56 for sending the input signal corresponding to the operation to the CPU 51.

Figure 2:
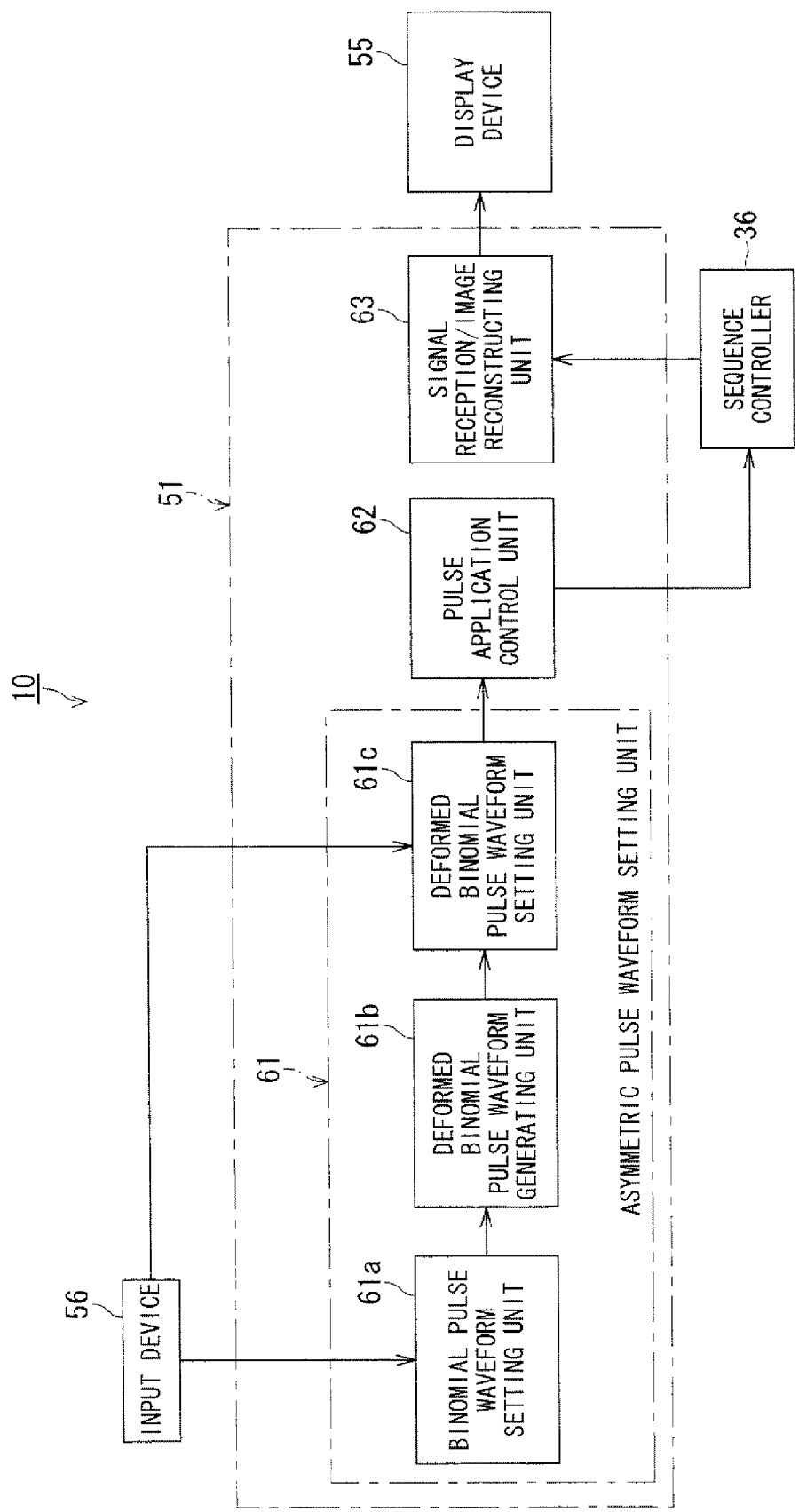
FIG. 2 is a block diagram showing functions of the MRI apparatus according to the embodiment.

FIG. 2 is a block diagram showing functions of the MRI apparatus 10 according to the embodiment.

The MRI apparatus 10 has a function as an asymmetric pulse waveform setting unit 61, a pulse application control unit 62, and a signal reception/Image reconstructing unit 63 shown in FIG. 2, because the CPU 51 (or CPU of the sequence controller 36) shown in FIG. 1 runs the program.

The asymmetric pulse waveform setting unit 61 has a function to set an RF pulse (described as an "asymmetric pulse" as follows) waveform of an anterior-posterior asymmetric. The asymmetric pulse waveform setting unit 61 sets the asymmetric pulse waveform such that a decreased ratio of the flip angle after an excitation center is different from an increased ratio of the flip angle to the excitation center. The asymmetric pulse waveform setting unit 61, for example, has a binomial pulse waveform setting unit 61a, a deformed binomial pulse waveform generating unit 61b, and a deformed binomial pulse waveform setting unit 61c to set the asymmetric pulse waveform.

The binomial pulse waveform setting unit 61a has a function to set the desired binomial pulse waveform by operation of the operator via the input device 56.

Figure 3:
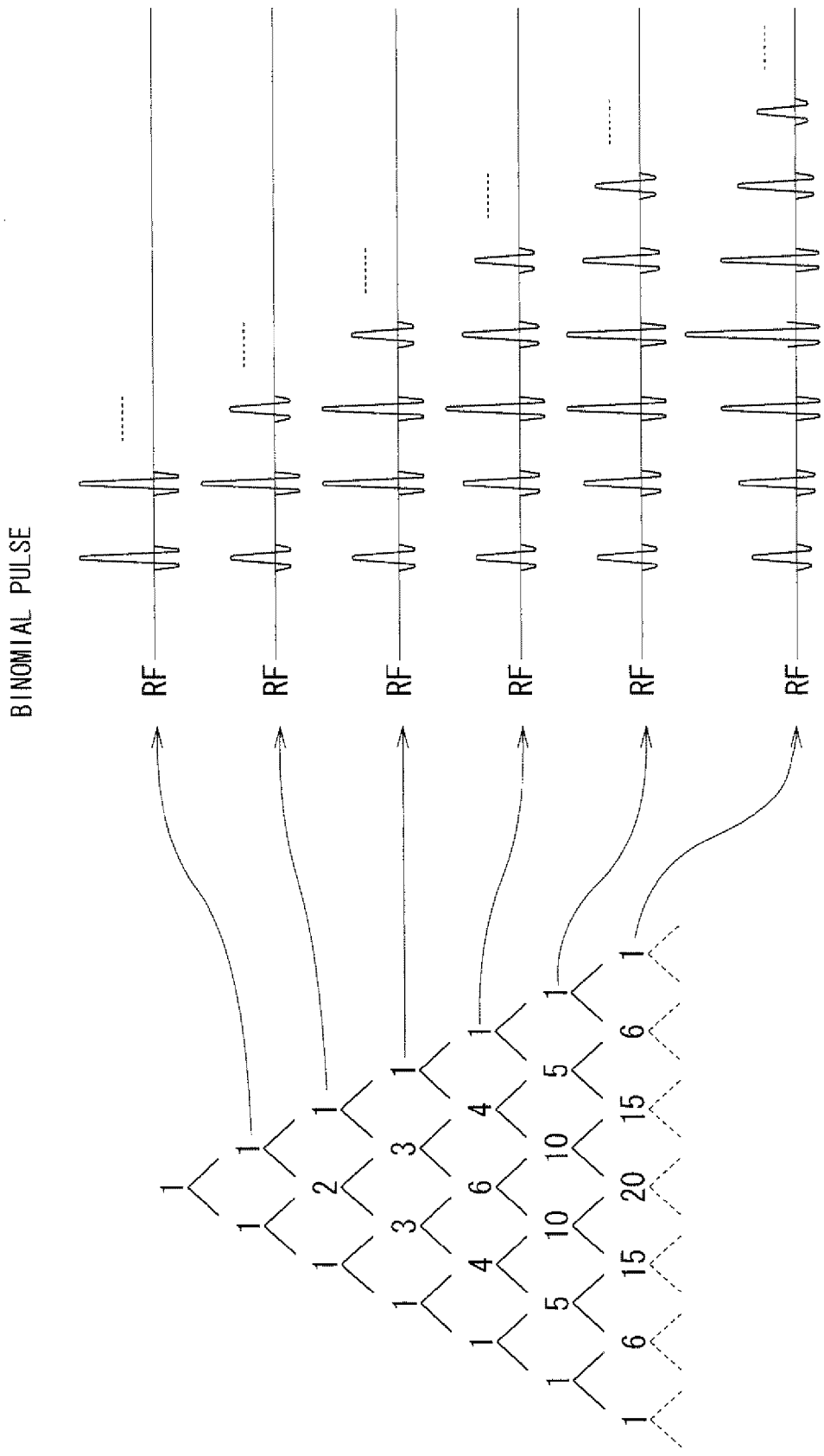
FIG. 3 is a view showing an example of a binomial pulse waveform.

FIG. 3 is a view showing an example of the binomial pulse envelopes.

FIG. 3 shows the binomial pulse envelope waveforms with a flip angle (resonant frequency intensity) flip-angle ratios of free water or bound water of 1-1 ratio series, 1-2-1 ratio series, 1-3-3-1 ratio series, 1-4-6-4-1 ratio series, 1-5-10-5-1 ratio series, 1-6-15-20-15-6-1 ratio series, respectively.

The deformed binomial pulse waveform generating unit 61b shown in FIG. 2 has a function to generate a deformed binomial pulse waveform, because the deformed binomial pulse waveform generating unit 61b deletes a portion waveform (deleted waveform) included in the binomial pulse waveform when the number of waves in the binomial pulse waveform, set by the binomial pulse waveform setting unit 61a, is 3 or more, and adds the flip angle calculated based on the deleted waveform to the residual waveform (added waveform). The deformed binomial pulse waveform generating unit 61b may generate the deformed binomial pulse waveform, because the deformed binomial pulse waveform generating unit 61b matches total flip angles by uniformly adding the flip angle calculated based on the deleted waveform to the added waveform. Further, the deformed binomial pulse waveform generating unit 61b may generate the deformed binomial pulse waveform, because the deformed binomial pulse waveform generating unit 61b matches total flip angles by proportionally adding the flip angle calculated based on the deleted waveform to the added waveform.

Note that, the deformed binomial pulse waveform generating unit 61b forms the added waveform by using waves from a beginning to the excitation center in the binomial pulse waveform when the number of waves for forming the binomial pulse waveform is an odd number. Meanwhile, the deformed binomial pulse waveform generating unit 61b forms the added waveform by using waves from a beginning to shortly after the excitation center in the binomial pulse waveform when the number of waves for forming the binomial pulse waveform is an even number. Note that, the deformed binomial pulse waveform generating unit 61b may form the waveform by using half of the waves in the binomial pulse waveform when the number of waves for forming the binomial pulse waveform is an even number.

Figure 5:
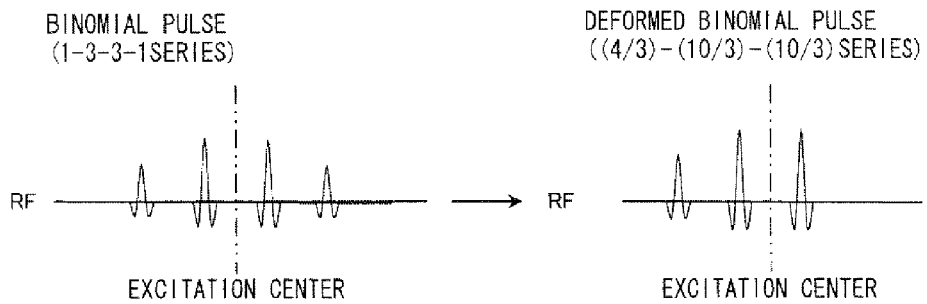
FIG. 5 is a view showing an example of a deformed binomial pulse waveform ((4/3)-(10/3)-(10/3) series.
Figure 6:
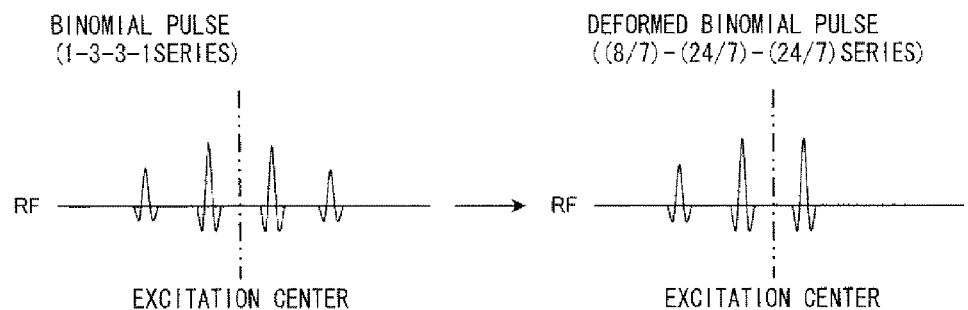
FIG. 6 is a view showing an example of a deformed binomial pulse waveform ((8/7)-(24/7)(24/7) series)
Figure 7:
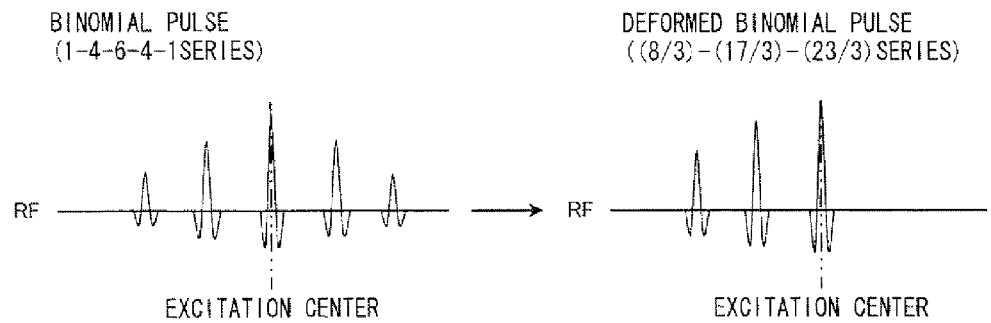
FIG. 7 is a view showing an example of a deformed binomial pulse waveform ((8/3)-(17/3)-(23/3) series)

FIG. 4 is an explanatory view showing an example where the deformed binomial pulse waveform as the asymmetric pulse waveform is generated. FIGS. 5-7 are views showing examples of the deformed binomial pulse waveform, respectively.

The number of the waves in a 1-3-3-1 series binomial pulse waveform showing in FIG. 4 is the even number. Consequently, the deformed binomial pulse waveform generating unit 61b generates a deformed binomial pulse waveform (shown in FIG. 5) with the flip angle ratio of (4/3)-(10/3)-(10/3) series by uniformly adding the flip angle of the deleted waveform to the remaining (sometimes herein referred to as added) waveforms, such that the total flip angles based on the 1-3-3-1 series binomial pulse waveform and the total of the flip angle based on the deformed binomial pulse waveform are equal i.e., the total flip angle remains unchanged).

Further, the deformed binomial pulse waveform generating unit 61b generates a deformed binomial pulse waveform (shown in FIG. 6) with the flip angle ratio of (8/7)-(24/7)-(24/7) series by proportionally adding the flip angle of the deleted waveform to the added waveform, such that the total flip angles based on the 1-3-3-1 series binomial pulse waveform and the total of the flip angle based on the deformed binomial pulse waveform are equal.

In addition, the number of the waves in a 1-4-6-4-1 series binomial pulse waveform showing in FIG. 4 is the odd number. Consequently, the deformed binomial pulse waveform generating unit 61b generates a deformed binomial pulse waveform (shown in FIG. 7) with the flip angle ratio of (8/3)(17/3)-(23/3) series by uniformly adding the flip angle of the deleted waveform to the added waveform, such that the total flip angles based on the 1-4-6-4-1 series binomial pulse waveform and the total of the flip angle based on the deformed binomial pulse waveform are equal.

Further, the deformed binomial pulse waveform setting unit 61c showed in FIG. 2 has a function to set the desired deformed binomial pulse waveform in accordance with the operation of the operator via the input device 56 when the deformed binomial pulse waveforms with plural flip angle ratios are generated by the deformed binomial pulse waveform generation unit 61b. Note that the deformed binomial pulse waveform setting unit 61c displays the binomial pulse waveform set by the binomial pulse waveform setting unit 61a and the deformed binomial pulse waveform generated by the deformed binomial pulse waveform generation unit 61b together on the monitor of the display device 55 such that the desired one of the binomial pulse waveform and the deformed binomial pulse waveform may be selected.

The pulse application control unit 62 has a function to control the transmitter 34 via the sequence controller 36 so as to control application of the frequency selective excitation pulse in accordance with the asymmetric pulse waveform set by the asymmetric pulse waveform setting unit 61.

Figure 8:
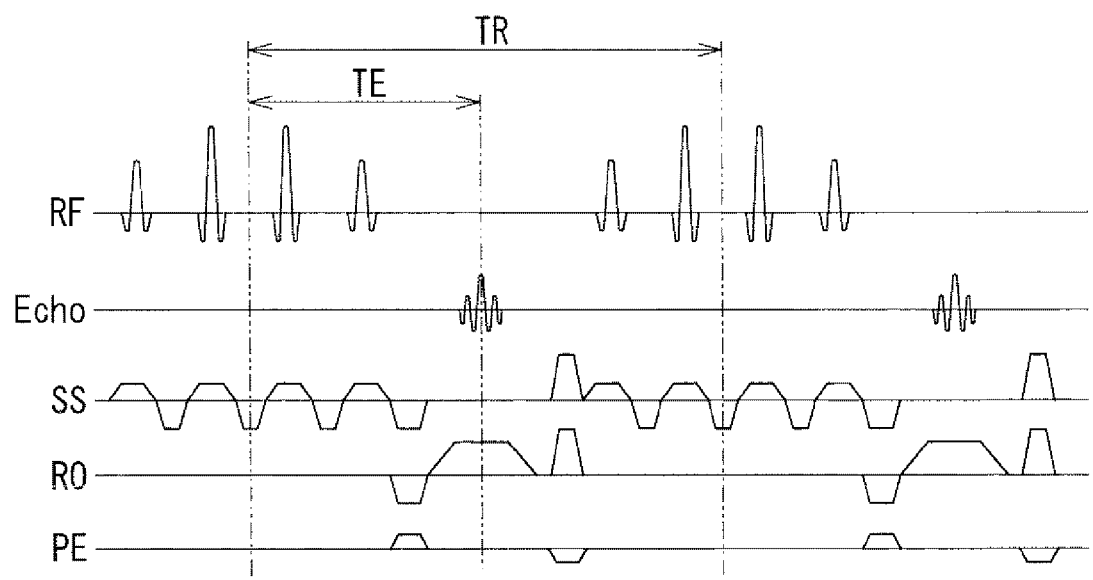
FIG. 8 is an example of the pulse sequence in accordance with the binomial pulse waveform.
Figure 9:
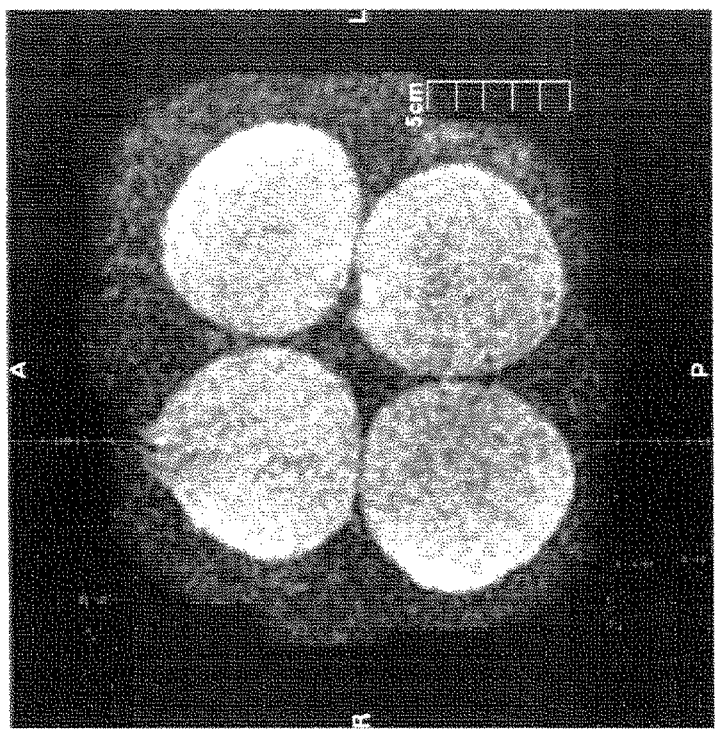
FIG. 9 is an example of a reconstructed MRI image by imaging based on a pulse sequence in accordance with the binomial pulse waveform at a resonant frequency of free water.
Figure 9:
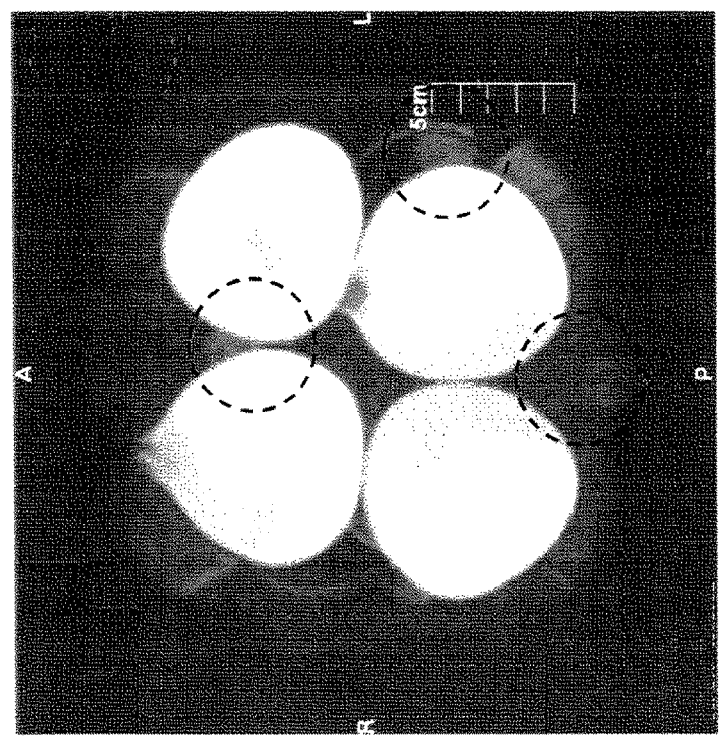

FIG. 8 is an example of the pulse sequence in accordance with the binomial pulse waveform. FIG. 8 shows the pulse sequence which contains the binomial pulse waveform with the flip angle ratio of 1-3-3-1 series. FIG. 9 is an example of MRI image reconstructed by imaging based on the pulse sequence in accordance with the binomial pulse waveform at the resonant frequency of free water. FIG. 9 shows the MRI images each reconstructed by imaging based on the pulse sequence which contains the binomial pulse waveform with the flip angle ratios of 1-1 series and 1-3-3-1 series, respectively.

The MRI image based on the pulse sequence in accordance with the binomial pulse waveform with the flip angle ratio of 1-1 series shown in the left side of FIG. 9 represents three sections (dashed line sections in FIG. 9) of fat region indicated by broken lines. The MRI image based on the pulse sequence in accordance with the binomial pulse waveform with the flip angle ratio of 1-3-3-1 series shown in the right side of FIG. 9 represents no fat region. However, a signal to noise (S/N ratio) is lowered owing to long pulse length.

Figure 10:
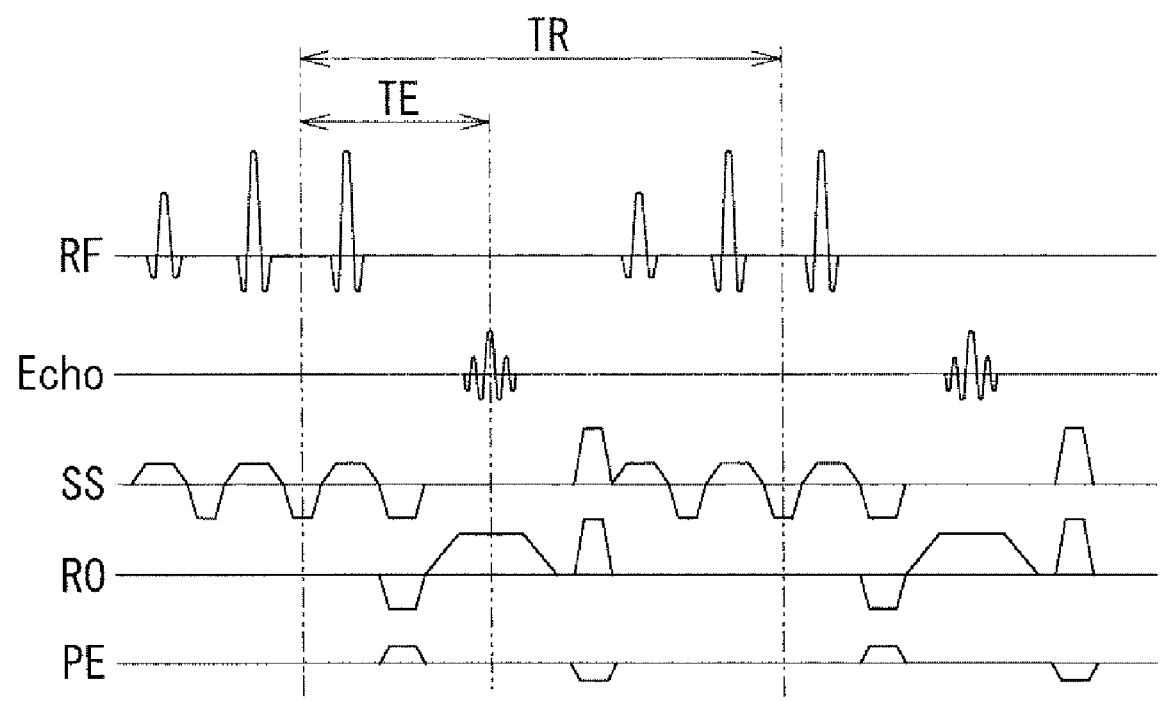
FIG. 10 is an example of the pulse sequence in accordance with the asymmetric pulse waveform.

FIG. 10 is an example of the pulse sequence (field echo process) in accordance with the asymmetric pulse waveform set by the asymmetric pulse waveform setting unit 61. FIG. 10 shows the pulse sequence which contains the (8/7)-(24/7)-(24/7) series deformed binomial pulse waveform set by the deformed binomial pulse waveform setting unit 61c.

Referring to FIG. 10, the use of the pulse sequence which contains the deformed binomial pulse waveform shown in FIG. 10 reduces the pulse length compared with the pulse sequence which contains the binomial pulse waveform as shown in FIG. 8. Accordingly, both the TE and TR may be reduced, thus reducing the imaging time.

Further, the signal reception/image reconstructing unit 63 shown in FIG. 2 has a function to control the receiver 35 to control reception of the NMR signal via the sequence controller 36, and to reconstruct the MRI image based on the received NMR signal. The MRI image reconstructed by the signal reception/image reconstructing unit 63 is stored in the data storage unit such as the HD 53, or displayed on the monitor of the display device 55.

Figure 11:
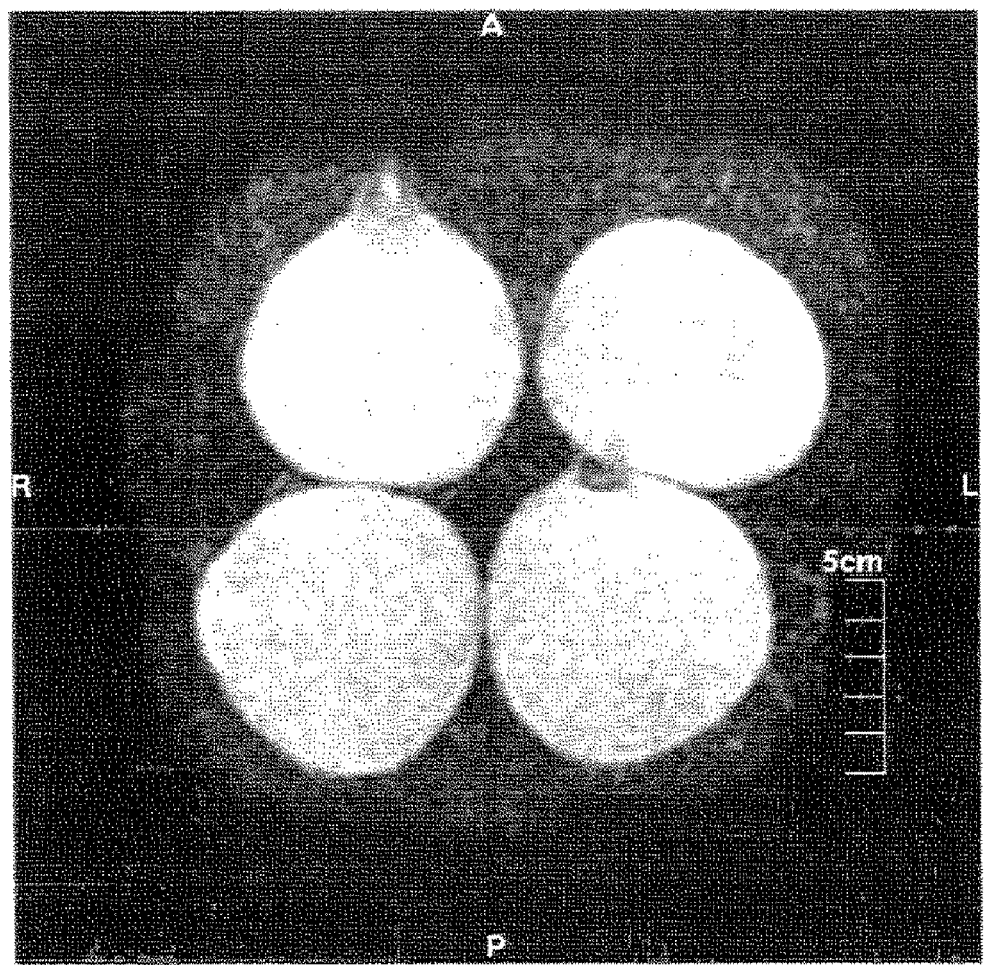
FIG. 11 is an example of a reconstructed MRI image by imaging based on a pulse sequence in accordance with the asymmetric pulse waveform at a resonant frequency of free water.

FIG. 11 is an example of the reconstructed MRI image by imaging based on the pulse sequence in accordance with the deformed binomial pulse waveform at the resonant frequency of the free water. FIG. 11 shows an example of the reconstructed MRI image by imaging based on the pulse sequence which contains (8/7)-(24/7)-(24/7) series deformed binomial pulse waveform.

Referring to FIG. 11, the residual fat portion on the MRI image shown at the left side of FIG. 9 has been erased to improve segregation property upon water excitation, and further to clear the problem of degradation in the MRI image quality (deterioration in the effect for the fat suppression) due to susceptibility. The asymmetric pulse allows the pulse length to be shorter than the case of the binomial pulse so as to suppress lowering of the S/N ratio compared with the one at the right side of FIG. 9.

Note that, the effect of the operation of the MRI apparatus 10 upon water excitation with the pulse sequence shown in FIG. 10 has been described with the MRI image. The use of the MRI apparatus 10 improves the segregation property upon the fat excitation, and clears the problem of degradation in the image quality (deterioration in the effect for the water suppression) due to susceptibility.

In MRI apparatus 10, RF coil 24 is formed of a multi coil, which allows the user to perform a parallel imaging (PI) process where the multi coil is disposed at the interest site of patient P, for receiving NMR signal used in an reconstruction process. The use of the PI process allows the number of phase encodes required for reconstructing the MRI image to be decreased by an amount corresponding to the number of surface coils, thus reducing imaging time.

Further, in MRI apparatus 10, RF coil 24 is formed of a multi coil, which allows the user to perform a transmit sense process where the multi coil is disposed a the interest site of patient P, and the RF pulse is transmitted from the multi coil for the imaging operation.

MRI apparatus 10, at imaging time, sets the binomial pulse by the binomial pulse waveform setting unit 61a shown in FIG. 2, and then the deformed binomial pulse is generated by the deformed binomial pulse generating unit 61b. However, the present exemplary embodiment is not limited to the aforementioned structure. For example, the MRI apparatus 10 may be structured to allow the deformed binomial pulse generating unit 61b to preliminarily generate the deformed binomial pulses corresponding to the binomial pulses, and to read the deformed binomial pulse corresponding to the binomial pulse set by the binomial pulse waveform setting unit 61a so as to be set upon execution of the imaging operation at the time of image data acquisition.

The use of MRI apparatus 10 according to the embodiment may reduce pulse length to decrease both TE and TR, and accordingly, imaging time is reduced. This may alleviate stress to patient P during imaging operations.

Further, the use of MRI apparatus 10 is capable of providing an optimized MRI image for image diagnosis.

What is claimed is:

1. An MRI apparatus comprising:
a waveform setting unit configured to set an asymmetric binomial RF pulse waveform sequence including at least three RF pulses which are asymmetrically positioned with respect to an excitation center so as to impose unequal nuclear magnetic resonant (NMR) flip angles prior to and subsequent to said excitation center thus facilitating reduced length of the excitation binomial RF pulse waveform sequence and reduced imaging time;
an applying control unit configured to control application to a subject of said RF pulses in accordance with the set asymmetric binomial RF pulse waveform sequence;
a reconstructing unit configured to reconstruct an image based on MRI RF signals received in response to the applied asymmetric RF pulse waveform sequence; and
a display control unit configured to control a display of the reconstructed image.

2. The MRI apparatus according to claim 1, wherein the waveform setting unit sets the asymmetric binomial RF pulse waveform sequence such that there is a decreased flip angle imposed after an excitation center of the asymmetric binomial RF pulse waveform sequence as compared to the flip angle imposed prior to the excitation center.

3. The MRI apparatus according to claim 1, wherein the waveform setting unit includes a first waveform setting unit configured to set a desired binomial pulse waveform sequence, and a second waveform setting unit configured to generate and set a deformed binomial pulse waveform sequence as the asymmetric binomial RF pulse waveform by deleting an RF pulse included in the binomial pulse waveform sequence and by adding an additional flip angle calculated based on the deleted RF pulse to the remaining RF pulses in the deformed sequence.

4. The MRI apparatus according to claim 3, wherein the second waveform setting unit forms the added flip angle by modifying RF pulses prior to an excitation center in the binomial pulse waveform when the number of RF pulses used to form the binomial pulse waveform sequence is an odd number, and forms the added flip angle by using modified RF pulses prior to and shortly after the excitation center when the number of RF pulses used to form the binomial pulse waveform sequence is an even number.

5. The MRI apparatus according to claim 3, wherein the second waveform setting unit generates the deformed asymmetric binomial pulse waveform sequence by matching a total flip angle amount by uniformly adding a flip angle amount calculated based on the deleted RF pulse to the modified waveform.

6. The MRI apparatus according to claim 3, wherein the second waveform setting unit generates the deformed asymmetric binomial pulse waveform by matching a total flip angle amount by proportionally adding a flip angle amount calculated based on the deleted RF pulse to the modified waveform.

7. The MRI apparatus according to claim 1, wherein the applying control unit controls the application to a subject of said RF pulses in accordance with a resonant frequency of free water.

8. The MRI apparatus according to claim 1, wherein the applying control unit controls the application to a subject of said RF pulses in accordance with a resonant frequency of bound water.

9. The MRI apparatus according to claim 1, wherein the reconstructing unit receives an NMR signal from a multi coil in parallel by using the multi coil as an RF coil.

10. The MRI apparatus according to claim 1, wherein an RF coil is used as a multi coil from where the asymmetric binomial RF pulse waveform sequence is transmitted in parallel.

11. An MRI apparatus configured for generating an MRI image using a binomial RF pulse waveform sequence in order to excite a species of nuclide, said apparatus comprising:
   a waveform setting unit configured to generate and set a deformed binomial RF pulse waveform sequence having at least three RF pulses by deleting a portion of a binomial RF pulse waveform sequence and by also adding a flip angle amount calculated based on the deleted portion to the remaining waveforms of the sequence which has RF pulses that are asymmetrically positioned with respect to an excitation center so as to impose unequal nuclear magnetic resonant (NMR) flip angles prior to and subsequent to said excitation center thus facilitating a reduced length of the excitation binomial RF pulse waveform sequence and reduced imaging time; and
   an applying control unit configured to control application to a subject of the deformed binomial RF pulse waveform sequence set by the waveform setting unit.

12. An MRI apparatus configured for generating an MRI image using a binomial RF pulse waveform sequence in order to excite a species of nuclide, said apparatus comprising:
   a waveform setting unit configured to generate and set a deformed binomial RF pulse waveform sequence by sharing an intensity or a flip angle value, used for at least one RF pulse of a non-deformed binomial RF pulse waveform sequence with the RF pulses, of the deformed binomial RF pulse waveform sequence, having RF pulses which are asymmetrically positioned with respect to an excitation center so as to impose unequal nuclear magnetic resonant (NMR) flip angles prior to and subsequent to said excitation center thus facilitating a reduced length of the excitation binomial RF pulse waveform sequence and a reduced imaging time; and
   an applying control unit configured to control an application to a subject of the deformed binomial RF pulse waveform sequence set by the waveform setting unit.

13. A method for generating an MRI image using a binomial RF pulse waveform sequence, said method comprising:
   a waveform setting unit configured to generate and set a deformed binomial RF pulse waveform sequence by adding an intensity or a flip angle value used for at least one RF pulse of a non-deformed binomial RF pulse waveform sequence to remaining RF pulses of the deformed binomial RF pulse waveform sequence, with the deformed binomial RF pulse waveform sequence having RF pulses which are asymmetrically positioned with respect to an excitation center so as to impose unequal nuclear magnetic resonant (NMR) flip angles prior to and subsequent to said excitation center thus facilitating a reduced length of the excitation binomial RF pulse waveform sequence and a reduced imaging time; and
   an applying control unit configured to control an application to a subject of the deformed binomial RF pulse waveform sequence set by the waveform setting unit.

* * * * *